(12) United States Patent
Mauger et al.

(10) Patent No.: US 7,233,349 B2
(45) Date of Patent: Jun. 19, 2007

(54) VIDEO TIMING DISPLAY INDICATOR

(75) Inventors: Randy A. Mauger, Douglassville, PA (US); Robert C. Zwiebel, Coopersburg, PA (US); David R. Guerrero, Center Valley, PA (US)

(73) Assignee: Videotek, Inc., Pottstown, PA (US)

( * ) Notice: Subject to any disclaimer, the term of this patent is extended or adjusted under 35 U.S.C. 154(b) by 470 days.

(21) Appl. No.: 10/931,538

(22) Filed: Sep. 1, 2004

(65) Prior Publication Data

US 2006/0044391 A1    Mar. 2, 2006

(51) Int. Cl.
*H04N 17/00* (2006.01)
*H04N 17/02* (2006.01)
*G01R 13/00* (2006.01)
*G01R 13/02* (2006.01)
*G01R 29/26* (2006.01)
*G06F 19/00* (2006.01)

(52) U.S. Cl. .................. 348/184; 348/180; 348/181; 348/185; 702/67; 702/68; 702/69; 702/71

(58) Field of Classification Search .......... 348/180, 348/181, 104, 185; 702/66, 67, 68, 69, 71
See application file for complete search history.

(56) References Cited

U.S. PATENT DOCUMENTS

| | | | | |
|---|---|---|---|---|
| 5,353,117 A | * | 10/1994 | Holman et al. | 348/183 |
| 5,446,492 A | * | 8/1995 | Wolf et al. | 348/192 |
| 5,596,364 A | * | 1/1997 | Wolf et al. | 348/192 |
| 5,894,324 A | * | 4/1999 | Overton | 348/181 |
| 6,057,882 A | * | 5/2000 | van den Branden Lambrecht et al. | 348/192 |
| 6,069,607 A | * | 5/2000 | Everett et al. | 345/660 |
| 6,084,566 A | * | 7/2000 | Tsai et al. | 715/500.1 |
| 6,275,257 B1 | * | 8/2001 | Tallman et al. | 348/184 |
| 6,366,314 B1 | * | 4/2002 | Goudezeune et al. | 348/192 |
| 6,496,221 B1 | * | 12/2002 | Wolf et al. | 348/192 |
| 6,532,024 B1 | * | 3/2003 | Everett et al. | 715/716 |
| 6,681,191 B1 | * | 1/2004 | Pickerd et al. | 702/76 |
| 6,741,277 B1 | * | 5/2004 | Rau | 348/181 |
| 6,847,395 B2 | * | 1/2005 | Thomas et al. | 348/180 |
| 6,917,889 B2 | * | 7/2005 | Ward et al. | 702/67 |
| 7,071,852 B1 | * | 7/2006 | Wegener | 341/61 |
| 7,099,518 B2 | * | 8/2006 | Li et al. | 382/255 |

(Continued)

OTHER PUBLICATIONS

TEKTRONIX, Inc., Technical Brief (Facility Timing Made Easy), website www.tektronix.com/video_audio, U.S. Copyright 2003.

*Primary Examiner*—Brian P. Yenke
(74) *Attorney, Agent, or Firm*—Duane Morris LLP

(57) ABSTRACT

A timing alignment or offset display shows the relationship between a reference signal and a test signal, in particular two analog or digital video signals. Timing extraction circuits derive a lower frequency signal synchronized to horizontal lines and a higher frequency signal synchronized to the pixel sampling rate. A reference time pulse is also derived from the reference signal. Two offsets are counted by determining a line count and a sample or clock cycle count between corresponding reference points in the test and reference signals. A coarse line count offset and a fine timing offset are thereby obtained and are displayed by movable markers on opposite sides of a scale line. The markers are centering and aligned when the frame/field alignment and the color and/or sample portions of the signals correspond in time. Tabular data, distinct coloring and alarms also are depicted.

17 Claims, 6 Drawing Sheets

U.S. PATENT DOCUMENTS

| | | | |
|---|---|---|---|
| 7,158,137 B2 * | 1/2007 | Dobyns et al. | 345/440.1 |
| 7,159,187 B2 * | 1/2007 | Bernard et al. | 715/771 |
| 2002/0047902 A1 * | 4/2002 | Thomas et al. | 348/180 |
| 2003/0220753 A1 * | 11/2003 | Pickerd et al. | 702/67 |

* cited by examiner

VIDEO TIMING DISPLAY INDICATOR

FIELD OF THE INVENTION

The invention relates to test equipment and methods for processing video signals, namely either analog or digital signals, particularly in video production environments, wherein it is useful graphically to display the timing relationship between a video signal and a reference, such as a second video signal.

PRIOR ART

There are various reasons in video production, recording, playback, broadcasting and other such environments to pay attention to the extent to which a video signal is synchronized or aligned in time with a reference.

In digital signal processing devices such as switchers and frame synchronizers, video data is treated as repetitive samples or as groups of samples (e.g., a cached image frame). The receiving device often can compensate for timing offsets between respective sources by operating through buffered delays, but timing adjustments may nevertheless be necessary. Sampling of the luminance and color difference or RGB data values is at a high frequency. Timing of the samples is important to efficient handling of the data.

Digital signal processing devices typically produce an image data buffer that is read out repetitively to a picture display device that likewise can be analog or digital. In analog signal processing systems, the incoming signal often directly controls operation of the display device, for example controlling electron beam amplitude during beam deflection. Timing is important to the correct operation of the display device. Subcarrier phase measurements and nanoseconds delay corrections are needed for correct color display.

Conventionally, coarse timing to match a test signal to a reference signal might be made using an oscilloscope or similar time waveform monitor. This may involve aligning the signals in registry such that the vertical and horizontal retraces correspond to the reference signal timing and the successive horizontal lines, vertical fields and frames all are in time registry with the reference (i.e., starting and ending at the same times). Fine tuning is then accomplished using a vectorscope to adjust the phase relationship of the color aspects of the signal.

Adjustments can concern a given horizontal line or a pixel position on a line, but a timing measurement at a particular spot in the repetitive signal (e.g., a given pixel) may not hold true across the entire area, and a timing measurement at a particular time may not hold true for a long time. If a time offset involves a number of horizontal lines or a time span, other measurements and adjustments may be needed. In this context, it should be noted that a time offset may be such that one or the other of two signals leads or lags the other, such that the offset could be positive or negative between the test signal and the reference signal, or vice versa.

Insofar as analog video signal processing systems control the display device, such systems are relatively intolerant to variations in the timing between two signals to be switched or faded or otherwise operated in conjunction with one another. A digital signal processing system may be tolerant of some types of variations in timing, for example with delays being made up by buffering. At the same time, digital signals are subject to more substantial offsets.

It would be advantageous to provide video test equipment to assist in the necessary measurement and adjustment of such signals, that is capable of dealing with both coarse and fine timing issues and perhaps does not require reference to a vectorscope or similar color related reference in order to deal with timing alignments.

On a coarse level, one timing need is to synchronize vertical and horizontal positioning with operation of the display device, such as deflection of an electron beam in an analog CRT arrangement. A different but related timing need is the close matching of signals produced by two sources from pixel data values presumably loaded into a display memory in a digital counterpart of an analog display.

The large scale or coarse timing issues are on the order of the frequency of raster horizontal lines, counted to make up vertically adjacent groups (fields and frames). The fine horizontal timing issues are pertinent to nanosecond phase adjustments amounting to a portion of a period of the subcarrier in an analog signal and to a similar degree of precision when employing successive color difference samples.

Both the coarse and fine timing scales are periodic. Both represent an offset or time difference that also corresponds to a spatial difference in the displayed signal. The spatial difference is on a different time scale between lines or pixels versus between color phases at a given pixel comprising plural color components).

In measuring or indicating time differences, one can consider vertical related time differences as corresponding to a vertical distance on a display. Vertical time differences in that case have a resolution related to the number of horizontal lines in a field or frame. Similarly, a horizontal time difference relates to a horizontal distance and could involve a count of pixel positions at the maximum resolution. In digital sampling systems, the pixel positions of the samples have a frequency and/or period that is comparable to less than the period of a analog subcarrier.

The maximum difference in time (or space) between referenced points (or pixels) occurring at cross referenced points in two different video signals can be equated to the total number of horizontal lines (the vertical offset) scans and also the number of horizontal sample increments or divisions of the periods of the subcarrier so as to define color phases within those periods (the horizontal offset). The time difference may concern a span of hundreds of horizontal lines between points in adjacent fields or frames. The time difference also is the difference between successive samples of sets of luminance and color difference values. Inasmuch as the two signals are periodic, either of the two signals might be the "first" signal, with reference to an arbitrary X-Y pixel position having an offset in time relative to the same pixel position in the "second" signal.

One objective in designing articles of test equipment to provide test results with a balance between generality and detail as needed, and wherein the information is presented in a clear and readily understood way, i.e., without typically needing to be studied to obtain the information wanted. This includes test equipment intended to show a time offset between a reference time point and a selected measurement target point in a video signal. The reference can be a common reference signal employed by a video facility such as a broadcast facility, compared to a same relative position in a second video signal that is to be switched in or faded or merged or otherwise handled seamlessly relative the first. It would be advantageous to provide an easily used and understood graphic display to show how the two video signals compare in time.

As discussed, the typical way to deal with measurement and display of vertical (coarse registration) and horizontal (fine color alignment) offsets is to use different display devices (a time scan oscilloscope trace and a polar plotting vectorscope wherein the X and Y axes are color difference values).

The timing display function of the Tektronix WVR600 series Digital and Composite Waveform Rasterizers uses a single display simultaneously to show vertical and horizontal timing by vertical and horizontal positioning of two movable symbols on a display field. The WVR600 timing display mode presents a circle symbol ("○") in the center of a display screen to represent a reference periodic timing reference signal, such as one of two video signals to be compared. The second or test signal is represented on the display by a cross-hair ("+") that is movable vertically and horizontally to align with the circle. The respective vertical and horizontal timing offsets between the test signal and the reference are represented by the vertical and horizontal spatial offset. When the two signals are precisely aligned in time, the displayed symbols are aligned in space on the display (⊕), intuitively handling the display in a manner similar to the aiming of gunsights.

The Tektronix WVR600 gunsight target is highly graphic, which helps to convey the idea of alignment versus misalignment. However, the display does not intuitively correspond to the problem of displaying video offsets in time. The vertical count of horizontal lines and the horizontal alignment of color phase are indeed "vertical" and "horizontal," respectively. Insofar as there is a relationship of time offset to display position, it does not correspond to the X and Y positioning of the target symbols. The line count and color alignment offset times are grossly different in time scaling. This aspect is lost in the gunsight target display.

It would be advantageous to provide a timing offset display that is graphic and that conveys information intuitively, including a display having the capability of indicating coarse and fine time offsets and adjustments, but which acts in a way that is optimally useful in analog and digital test and measurement contexts.

SUMMARY OF THE INVENTION

An object of the invention is to provide an optimally useful display to show the time relationship between a test video signal and a reference video signal, useful in connection with digital or analog video systems, and which simultaneously shows both the coarse alignment or offset of the signals with respect to the boundaries of frames and fields, in particular showing an offset of line counts, and also shows the fine alignment of the signals on the scale of the phase of a color subcarrier or a pixel sample rate, in the same display.

These and other objects are met according to the invention in a timing alignment or offset display apparatus and method that show the relationship between a reference signal and a test signal, in particular two analog or digital video signals. Timing extraction circuits derive a lower frequency signal synchronized to horizontal lines and a higher frequency signal synchronized to the pixel sampling rate. A reference time pulse is also derived from the reference signal. Two offsets are counted by determining a line count and a sample or clock cycle count between corresponding reference points in the test and reference signals. A coarse line count offset and a fine timing offset are thereby obtained and are displayed by movable markers on opposite sides of a scale line. The markers are centering and aligned with the frame/field alignment and the color and/or sample portions of the signals correspond in time. Tabular data, distinct coloring and alarms also are depicted.

Additional objects and aspects of the invention will be made apparent by the following non-limiting description of examples and preferred embodiments.

BRIEF DESCRIPTION OF THE DRAWINGS

A number of additional objects and aspects are apparent from the appended description and the associated illustrations of preferred embodiments, wherein.

DETAILED DESCRIPTION

Figure 1:
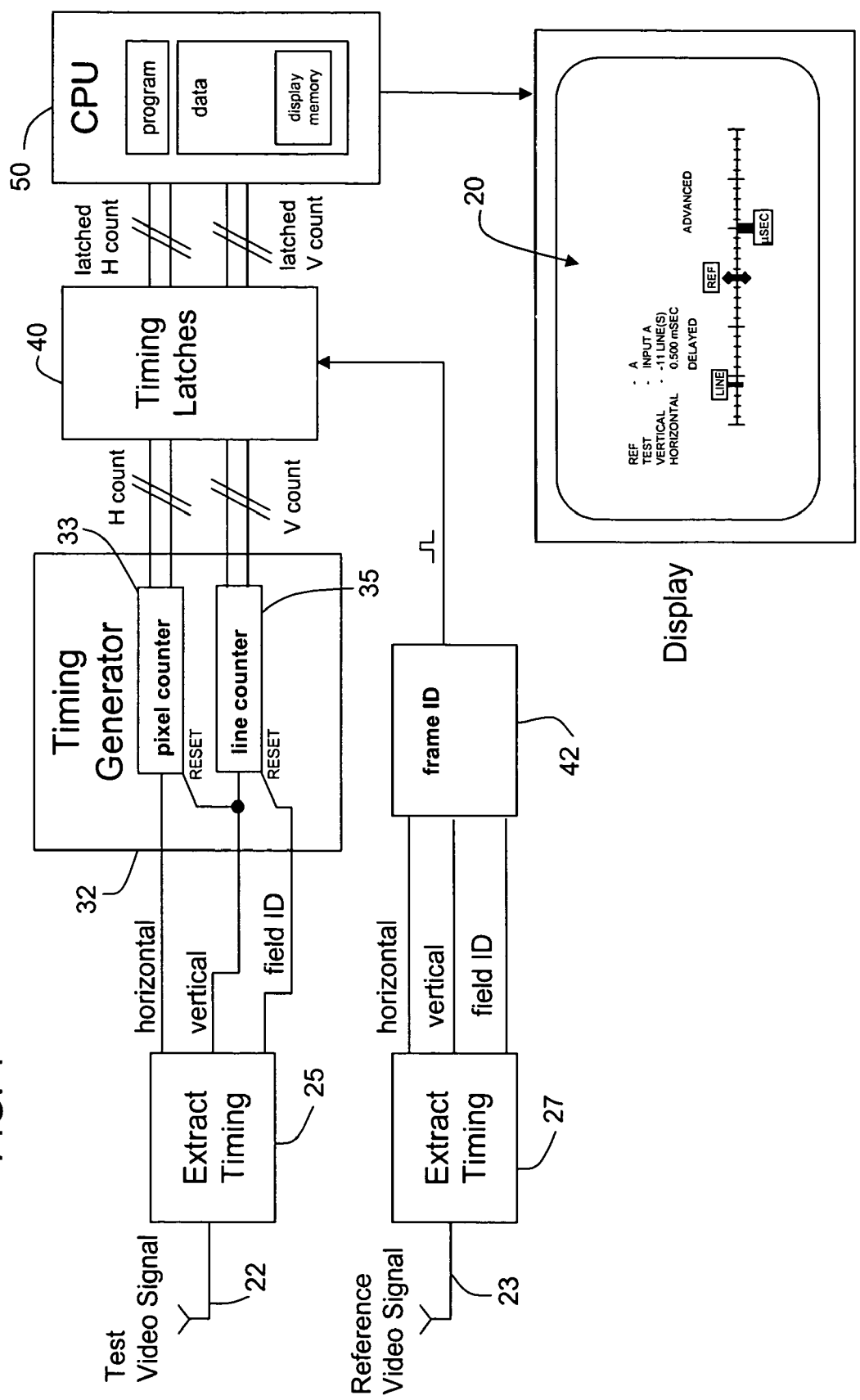
FIG. 1 is a block diagram illustration of an apparatus according to the invention.

Referring generally to the block diagram in FIG. 1, a display presentation 20 is generated to demonstrate the timing relationship between a test video signal at input 22 and a reference such as a second or reference video signal at input 23.

When a signal is processed, there is the potential for it to be delayed with respect to a reference signal. The timing display shown in FIG. 1 is used to indicate when a video input is deviating in time from the reference. The reference can be, for example, a video signal or at least synchronization elements, which are used in a video product facility as the standard to which secondary sources are matched when used in switching operations or the like.

The timing display as shown can be one of a plurality of display modes for presentation on a multi-format display apparatus such as disclosed in U.S. Pat. Nos. 6,069,607 and 6,532,024, which are hereby incorporated. Such apparatus include processors operable to generate alternative display formats as selected by the user, and can function by populating a display memory or display output signal that is used to produce an output image on a VGA or SVGA or other form of monitor device.

As shown in FIG. 1, the test video signal at input 22 is applied to a timing extraction circuit 25, which produces output pulse signals synchronized to the pixels or samples that correspond to serially adjacent positions along the horizontal lines in the video program ("horizontal"). The timing extraction circuit 25 also produces a pulse ("vertical") for each horizontal line in the succession of vertically adjacent horizontal lines in the video picture.

The timing extraction circuit 25 also produces a field ID signal that occurs at the completion of a video field and in the case of interleaved video can distinguish between fields. The outputs of the timing extraction circuit 25 are coupled to a timing generator block 32, which contains respective horizontal and vertical counters 33, 35, that respectively count time increments at the high frequency sampling or pixel rate and tat the lower frequency line rate.

The pixel counter 33 and line counter 35 can be reset so as to count lines over one field or frame, and to count pixels during each horizontal line, for example by resetting each counter as shown. The accumulated counts in the two registers are loaded in parallel into registers in a timing latch circuit 40, upon a pulse signal generated synchronously with the reference signal to which the test signal is being compared. Assuming that the reference signal is a second video signal, a timing extraction circuit 27 can be used to extract horizontal pixel displacement and vertical line displacement information, and a field ID value that can toggle in the case of interleaved fields. The reference timing signals are applied to a frame ID circuit 42 that produces one pulse output per frame, which can be arranged to occur consistently at an optionally selected point during the reference signal or simply at a known point such as the first pixel in the first line. The output pulse of frame ID circuit 42 loads the values H-count and V-count from counters 33, 35 into registers in latch 40, the outputs of which are coupled in turn to processor 50. The H count can be reset at each successive line. The V or line count is reset at each successive field or frame.

The processor 50 contains data memory including a display memory or buffer wherein the processor stores data in composing a display of contrasting luminance and colors so as to simulate a dual meter on display 20. The contents of the display memory are read out repetitively as the corresponding input signals 22, 23 vary.

Figure 2:
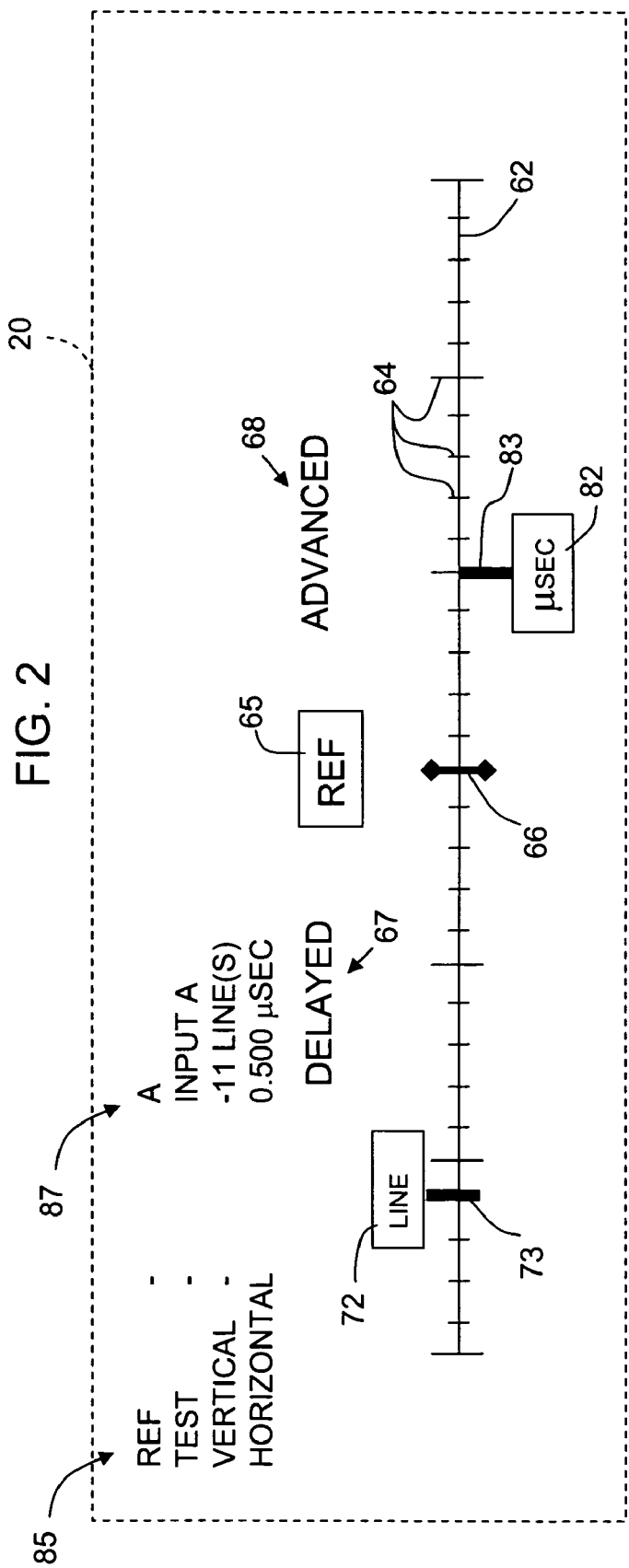
FIG. 2 is a plan view of a display presentation from the apparatus of FIG. 1, showing the time relationship between two arbitrary video signals.

FIG. 2 shows the timing offset display in a typical situation wherein there is some extent of timing offset between two arbitrary input signals. The static elements of the display presentation include a scale line 62 with graduation marks 64. A preferably-fixed reference indicator box 65 (labeled [REF]) is located at a nominal position such as the center of the timing display graduated line, also indicated by a distinct graduation line 66. Two legends 67, 68 show which side of the central mark or graduation 65, 66 indicates that the test signal is advanced and which side indicates delayed, relative to the reference signal whose timing is aligned to the distinct graduation line 66, preferably at the midpoint.

A first movable indicator box 72 (labeled [LINE]), preferably with an associated movable distinct graduation line marker 73, is placed by the display processor at the position corresponding on the graduation scale line to the vertical or line count offset determined from the line counter 35 in FIG. 1. In the example shown, the position of the LINE count indicator is determined with reference to a scale pitch or resolution of one horizontal line per graduation mark 64. A different scale pitch is possible, for example two lines per shorter graduation mark and ten lines per longer graduation mark. the LINE count indicator is generally placed above and over the graduation line 62.

A second movable indicator box 82 (labeled [μSEC]), also preferably having an associated movable distinct graduation line marker 83, is placed by the display processor at the position corresponding on the graduation scale line to the horizontal timing offset. This value is the count offset determined from the pixel counter 32 in FIG. 1. This counter is incremented at a timing offset that can be equal to one sample period at the highest sampling rate in a digital embodiment, which determines the resolution of the graduation scale marks 64. In an analog embodiment (or selectable analog mode of operation), the resolution should be a fraction of the period of the color subcarrier. The necessary frequency (i.e., a multiple of the subcarrier frequency) can be generated in the timing extraction circuit 25, e.g., using a multiplying phase locked loop or the like (not shown in FIG. 1). The horizontal offset indicator box 82 is generally on a an under the graduation line 62.

In the example shown in FIG. 2, the position of the LINE count indicators 72, 73 is determined with reference to a scale pitch or resolution of one horizontal line per graduation line. This is labeled as a "vertical" count in a text legend portion 85 because the horizontal lines are placed over one another in vertical succession, wherefore a given count of horizontal lines is intuitively considered a vertical displacement in a video picture. A different scale pitch is possible, for example two lines per short graduation line and ten per long graduation line, etc.

The position of the μSEC indicators 82, 83 in FIG. 2 is determined to a scale pitch or resolution of 100ηS per graduation mark 64. Again, a different resolution is possible.

Both the vertical and horizontal indicator sets 72, 73 and 82, 83, are positioned at either side of the central reference box 65 and marker 66, for indicating whether the test signal is advanced or delayed relative to the reference signal.

The display processor 50 also preferably provides tabular or numeric entries on the display area 20. A legend 85 names parameter categories and entries 87 state the values therefore. The two inputs are identified as the REF and TEST inputs. In this case, REF A has been selected and its offset is against TEST INPUT A. In a preferred arrangement, there can be more than one REF signal chosen among alternatives such as plural internally generated signals, plural inputs coupled as inputs to the test apparatus or the like.

The tabular entries in the display area 20 preferably include the numeric values that correspond to the indicated positions of the indicator blocks 72, 83, namely the line count and the horizontal color alignment offset. In FIG. 2, these delays are 11 lines and 500 ηS (or 0.5 μS), respectively, as might be obtained from two arbitrary signals.

Figure 3:
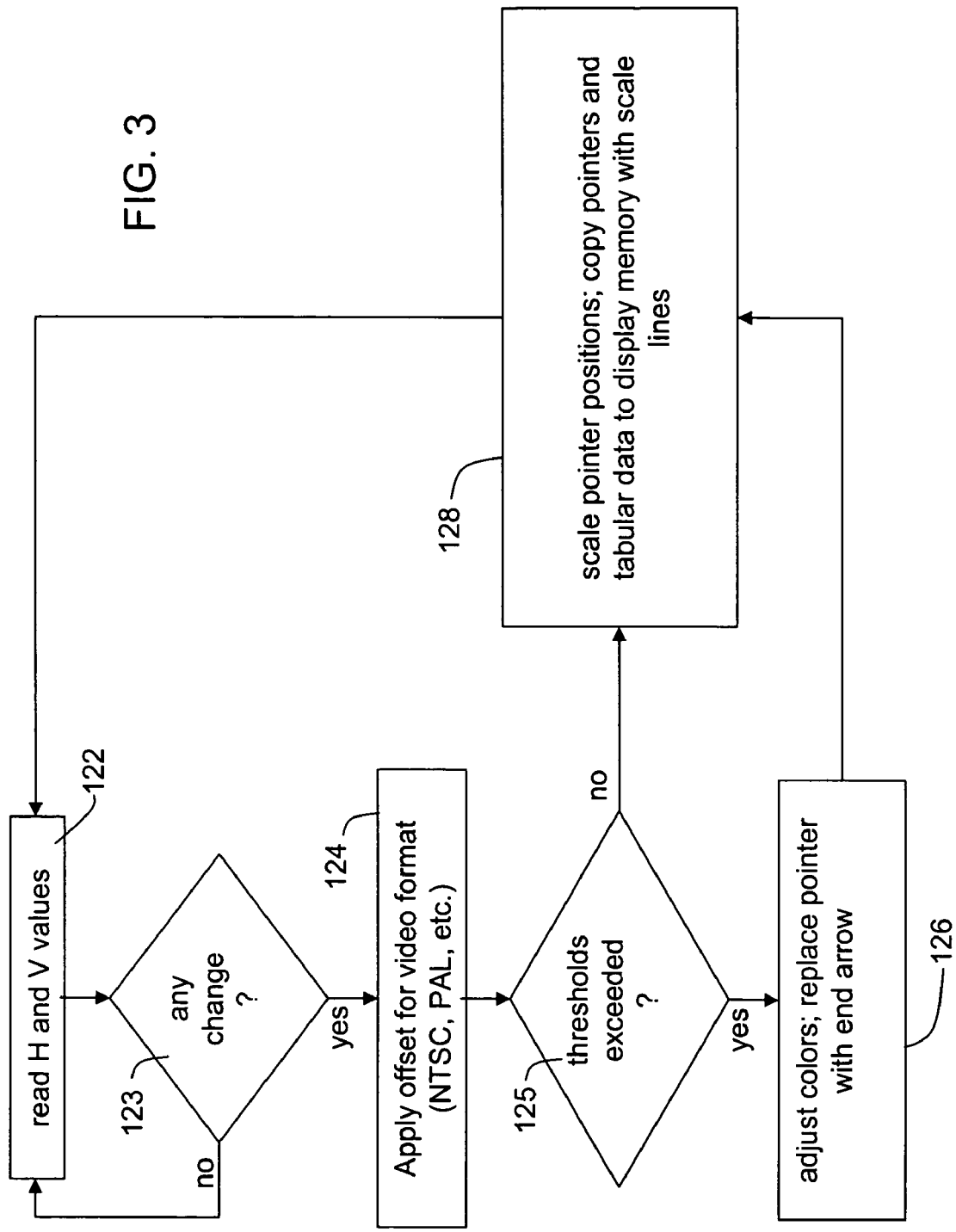
FIG. 3 is a flow chart showing steps in developing the display presentation of FIG. 2.

FIG. 3 is a flow chart showing the programmed steps of the display processor 50, taken in generating the contents of display area 20. The static part of the display contents can be stored in memory and used as the blank field on which contrasting pixel data is to be inserted to provide the movable elements in the display presentation.

As a first step 122, the processor reads the latched V and H counts from timing latches 40 (FIG. 1). If the values are unchanged, decision block 123 loops back, leaving the display memory unchanged. If the values have changed, the new values are stored and offsets are applied as necessary to the video format (NTSC, PAL, etc.) at step 124, to provide functionally similar line and timing indications regardless of format.

The scale line 62 in FIG. 2 only has sufficient span for a certain number of V line-count values and/or μSEC time period-count values. It is possible to have a changeable scale, but preferably instead, the scale values are preset and the manner of presentation of the display is changed if the count values run out of the span that can be displayed graphically. In FIG. 3 for this purpose, a decision step 125 includes comparing the data values to thresholds to determine whether a nominal or special display situation is presented. Step 126 concerns adjusting for a special situation. Step 128 finally comprises generating the display data in the display memory, whereupon a display driver (not shown) can present the data on a monitor or transmit the data for remote viewing, etc.

A special display situation can be presented wherein one or more values are found to be off the scale of scale line 62. Alternatively, user selectable thresholds can be involved to distinguish, for example by color, when the offset is more or less than some threshold warning level. A special display situation also may be presented (and a response accomplished through steps 125, 126) when one or more values is found to be aligned to the reference, or at least aligned to within some threshold value such as a within a single scale increment (zero to one line or zero to 100 ηS).

Figure 4:
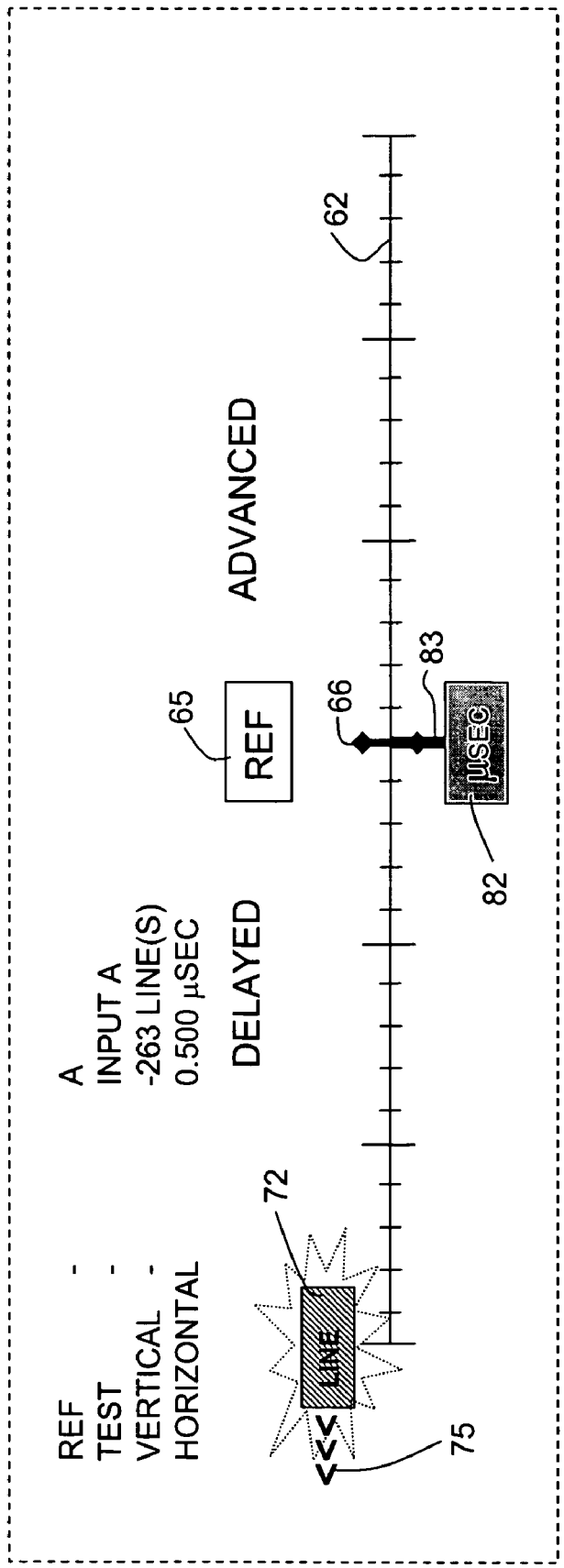
FIG. 4 is a plan view of the display presentation of FIG. 2, wherein the line count is off scales.
Figure 5:
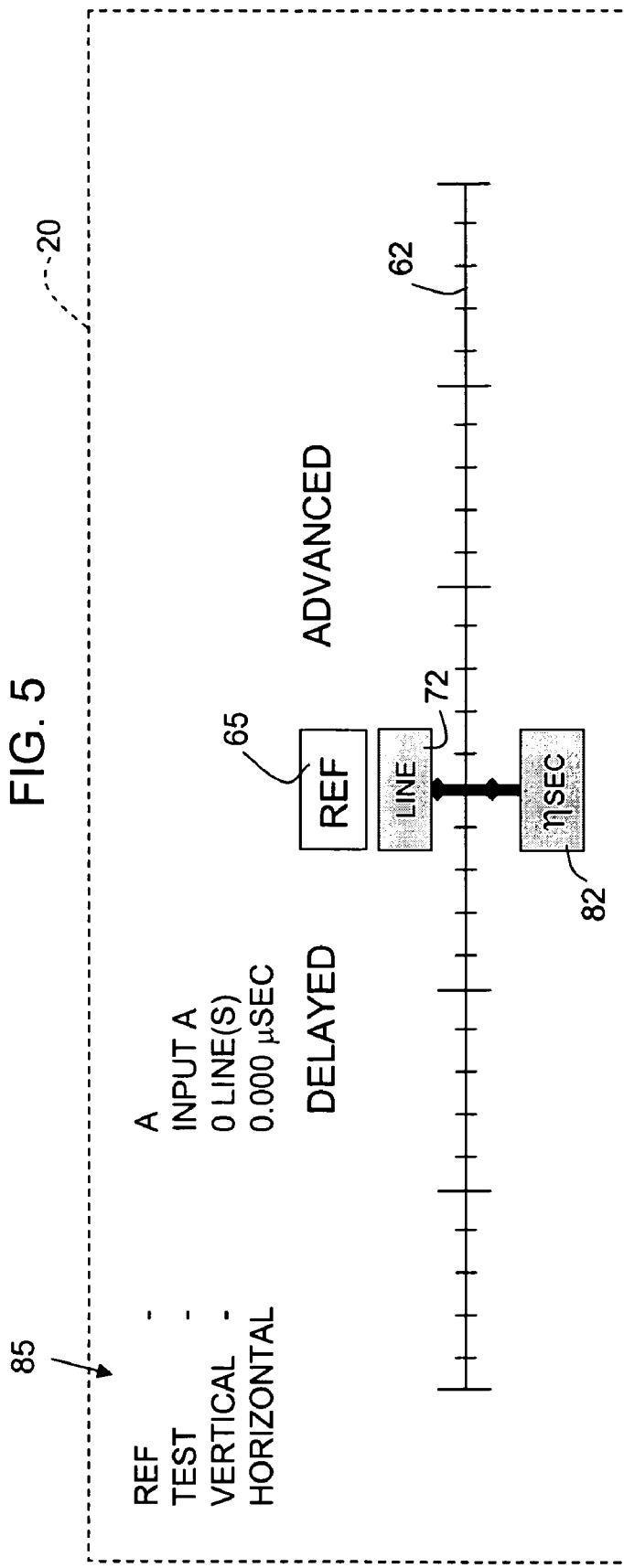
FIG. 5 is a plan view corresponding to FIGS. 2 and 4, showing the display for two signals that are aligned to the best resolution of the apparatus.

These special situations can be handled by varying the presentations used for the indicator boxes 72, 82 and/or associated lines 73, 83 and/or the fixed portions such as REF box 65 and center line 66. FIG. 4 shows one advantageous presentation. In this example, the H count is aligned and can be shown as a green box 82. The V or line count is off scale, which situation is shown by using a distinct color for box 72 (e.g., orange). Box 72 can be blinked. In lieu of an associated graduation line mark 73, an off-scale arrow can be presented. FIG. 5 shows a situation in which the reference and test inputs are fully aligned and both the V and H offsets are zero (or at least less than the smallest resolution of error).

In a preferred embodiment, the REF box is placed so as to represent the reference-timing points for the type of signal being monitored. The REF box is green when the vertical line count and horizontal color alignment time increment count (in nanoseconds or microseconds) cursors are all aligned.

If the test signal falls out of timing alignment with the reference, the line count marker 72 and the µSEC marker 82 are changed in color and moved outwardly in the appropriate Advanced or Delayed direction from REF. The REF box preferably is then colored red. Each hash mark proceeding outwardly from the reference point represents one line on the top scale and 100 ηS on the bottom scale. When line-count or µSEC values reach or exceed the edge of the scale span, an arrow such as arrow 75 is added to the right or left of the scale. On the other hand, when both signals are aligned, the REF box preferably is colored green.

Also in the preferred arrangement, the legend area of display area 20 contains category designations 85 and selections 87 including the following. REF is the selected reference input that represents the REF signal line in the display, which can preferably use one of several inputs or internally generated references (INPUT A, B, C, D, BB, TRI). Similarly, the TEST—indicator shows which of several possible input signals is currently selected to be the applicable test input to be monitored (A, B, C, or D). VERTICAL states the line offset count in full-video lines between the reference and the TEST video signal, including the capability to indicate positive or negative counts for leading or lagging. HORIZONTAL is the offset time in microseconds between the reference and the displayed video.

HORIZONTAL can be yellow at zero µSEC. It displays the minimum scale resolution at 100 ns and the minimum timing resolution at 37 ηSEC.

In a preferred arrangement, the subject timing indicator is one of a number of functions that are possible and can be selected in a multi-format display device. The device is capable of dealing with various signal conditions, but it is also possible that some signal conditions may be anomalous with respect to the idea of comparing line counts and the like. Therefore, the HORIZONTAL and the µSEC cursor are entirely blanked and will will not be caused to appear if the reference format has a different line length than the input format.

Thus, the LINE and µSEC cursors 72, 82 and preferably the associated legends are omitted if the timing display is selected but there is a combination of a TEST input format of SD (standard definition) and a REF format of HD (high definition) or TRI (tri-level). The cursors and legends also are omitted if the TEST input is HD and the REF format is SD or BB (external composite).

Figure 6:
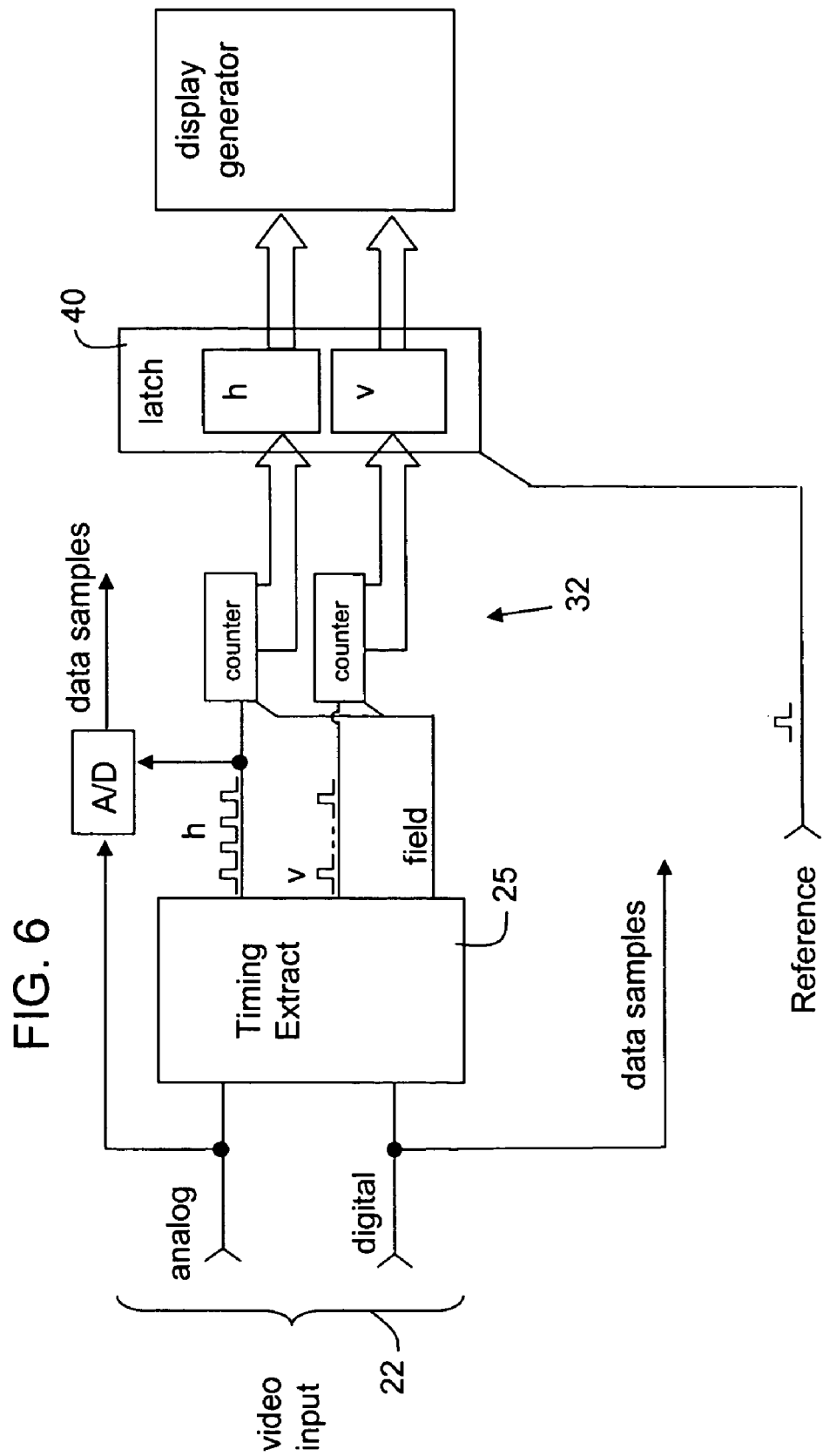
FIG. 6 is a block diagram showing a generalized embodiment of the invention.

The apparatus as disclosed can be used to reference a digital TEST input to an analog REF or vice versa. As shown generally in FIG. 6, an analog input applied to the timing extraction circuit can be used to derive the line count signal and a horizontal pixel sampling clock. As shown in FIG. 6, the reference signal used can be related to some outside timing reference as opposed to being derived specifically from one of two video signals.

The invention having been disclosed in connection with the foregoing preferred arrangements, variations will now be apparent, and should be considered encompassed within the scope and spirit of the invention.

What is claimed is:

1. An apparatus for displaying time offset information between a reference signal and a test signal having a repetitive signal format with successive data values appearing as successive segments of at least one of analog and digital data values, the apparatus comprising:
   a timing extraction circuit coupled to the test signal, the timing extraction circuit being operable to derive a first signal from a rate of said successive data values and a second signal from a rate of said successive segments;
   a timing generator coupled to the timing extraction circuit, the timing generator accumulating a first measure of elapsed time associated with said successive data values and a second measure of elapsed time associated with said successive segments;
   wherein the reference signal is coupled for at least one of loading to a register and resetting said first and second measures of elapsed time; and,
   a display processor operable to generate a graphic display from said first and second measures of elapsed time, the display processor providing at least partly coextensive scales wherein said first and second measures are displayed graphically for as coarse and fine measures of a time offset between the test signal and the reference signal.

2. The apparatus of claim 1, wherein the successive data values are successive periodic samples of a video signal at a pixel rate and the successive lines are horizontal lines in a video display.

3. The apparatus of claim 2, wherein the coarse and fine measures are respectively a line count and a time offset of a pixel sample period.

4. The apparatus of claim 1, wherein the test and reference signals are video timing signals and the timing extraction circuit is operable to produce a vertical rate signal, a horizontal rate signal and a field synchronizing signal for each of the test and reference signals.

5. The apparatus of claim 4, further comprising at least one register operable to distinguish between interleaved and non-interleaved fields and frames.

6. The apparatus of claim 4, wherein the timing generator comprises digital counters for the horizontal and vertical rate signals read into the display processor in conjunction with the reference signal.

7. The apparatus of claim 3, wherein the graphic display comprises a scale graduated according to different scale factors for the line count and the time offset of the pixel sample period.

8. The apparatus of claim 7, wherein the different scale factors are represented by opposite sides of a display line and the line count and the time offset are represented by markers movably positioned along the display line by the display processor.

9. The apparatus of claim 8, wherein the display line has graduated spans of a predetermined number of horizontal lines and a predetermined number of incremental offset time periods for respectively displaying variables including the line count and time offset variables, wherein at least one of the spans is less than a corresponding maximum deflection of a corresponding one of said variables, and wherein the display processor is operable to indicate an off-scale status of such one of the said variables.

10. The apparatus of claim 7, wherein the display processor is further configured to produce tabular numeric data representing values of the line count and time offset variables.

11. The apparatus of claim 7, wherein the display processor is operable to alter the display in at least one of characters, graphics, size, color, and animation for distinctly indicating states wherein the variables are respectively within a first preset threshold difference indicating acceptable match, and beyond a second preset threshold indicating an excess offset condition.

12. The apparatus of claim 11, wherein the second preset threshold is equal to a maximum scale represented on a graphic display line having separate scales for the line count and the time offset.

13. The apparatus of claim 12, wherein at least one of the scales and the preset thresholds is changeable.

14. A method for displaying coarse and fine correspondence in timing between a test video signal and a reference video signal, comprising:
   extracting signals synchronous with horizontal lines and with pixel sample values from the test video signal;
   extracting at least one timing reference signal from the reference video signal, wherein the timing reference signal has a fixed nominal relationship to horizontal lines and pixel sample valued from the reference video signal;
   counting a number of lines and a number of clock cycles between two corresponding points in the test and reference video signals;
   generating a display scale having a first scale line for a line count and a second scale line for a clock cycle count, and indicating a timing offset between the test and reference video signals by placing movable markers on the fist and second scale lines simultaneously to represent a coarse timing offset by identifying the line count and a fine timing offset by identifying the clock cycle count.

15. The method of claim 14, further comprising distinctly changing an appearance of the movable markers to indicate an offset that is at least one of greater than a maximum threshold and less than a minimum threshold.

16. The method of claim 15, wherein the maximum threshold is a full span of a corresponding one of the first and second scale lines.

17. The method of claim 14, further comprising presenting tabular numeric data in association with the movable markers and first and second scale lines.

* * * * *